United States Patent [19]

Lawrence et al.

[11] 4,213,187
[45] Jul. 15, 1980

[54] DIGITAL FILTERS WITH CONTROL OF LIMIT CYCLES

[75] Inventors: Victor B. Lawrence, Matawan; Debasis Mitra, Summit, both of N.J.

[73] Assignee: Bell Telephone Laboratories, Incorporated, Murray Hill, N.J.

[21] Appl. No.: 969,416

[22] Filed: Dec. 14, 1978

[51] Int. Cl.$^2$ .......................... G06F 15/34; G06F 7/48
[52] U.S. Cl. ...................................... 364/724; 364/745
[58] Field of Search ............................... 364/724, 745

[56] References Cited

U.S. PATENT DOCUMENTS

| | | | |
|---|---|---|---|
| 3,749,895 | 7/1973 | Kao | 364/745 |
| 3,777,130 | 12/1973 | Croisier et al. | 364/724 |
| 4,034,196 | 7/1977 | Butterweck et al. | 364/745 |
| 4,034,197 | 7/1977 | Lawrence et al. | 364/724 |

FOREIGN PATENT DOCUMENTS

7414848  5/1976  Netherlands .............................. 364/745

OTHER PUBLICATIONS

"A New Second-order Digital Filter . . . Oscillations", K. Meerkötter et al., *AEU, Elect. & Commun., Band 29,* 1975, pp. 312-314.
"A New Hardware Realization of Digital Filters", A. Peled et al., *IEEE Trans. on A.S.S.P.,* Dec. 1974, pp. 456-462.
"Iterative Logical Network for Parallel Multiplication", J. C. Hoffman et al., *Electronics Letters,* May, 3, 1968, p. 178.
*Digital Signal Processing Handbook,* J. R. Mick, Advanced Micro Devices, Inc., 1976, pp. 28-40.
"Suppression of Parasitic Oscillations . . . Rounding Arithmetic", H. Butterweck, *AEU, Elect. & Commun., Band 29,* 1975, pp. 371-374.
"A Novel Approach . . . Quantization Noise", M. Büttner, *Proc. 1976 IEEE Intl. Symp. Circuits & Systems,* pp. 291-294.
"Conrol of Limit Cycle Osc . . . Random Quantization", V. B. Lawrence et al., *IEEE Trans. on A.S.S.P.,* Apr. 1978, pp. 127-134.
"Suppression of Parasitic Oscillations . . . Filters", A. Fettweis et al., *IEEE Trans. on Circ. & Systems,* Mar. 1975, pp. 239-246.

*Primary Examiner*—Jerry Smith
*Attorney, Agent, or Firm*—Barry H. Freedman

[57] ABSTRACT

Limit cycles are eliminated in digital filters driven by zero, d.c. and period 2 inputs, by adjusting the filter output in response to the state variables present within the filter. The filter includes a quantizer (201) adapted to provide a fixed length output word p in response to an input y, where $p<y<p+k$ and k is the quantizer step size. The filter is further arranged to form the products $a \cdot X_n$ and $b \cdot X_n$, where a and b are multiplier coefficients and $X_n$ and $X_{n-1}$, the state variables, are once and twice delayed versions of the filter output $X_{n+1}$, and to combine the aforesaid products and the filter input $U_n$ to yield the value y. In accordance with the invention, the quantizer output is adjusted to p+k, if $X_{n-1} > p+k$ or
$X_{n-1} = p$ and $|X_n + \mathrm{Sgn}(a)X_{n-1}| \geq T$ or
$X_{n-1} = p+k$ and $|X_n + \mathrm{Sgn}(a)S_{n-1}| < T$, where T is a fixed threshold value and Sgn(a) is the sign of the multiplier coefficient a.

9 Claims, 6 Drawing Figures

DIGITAL FILTERS WITH CONTROL OF LIMIT CYCLES

FIELD OF THE INVENTION

This invention relates to method and apparatus for controlling limit cycles in second order recursive digital filters.

BACKGROUND OF THE INVENTION

The fact that a digital filter has a finite capacity and must therefore include a quantizer to adjust the internal word length used in the filter is the common cause for a variety of discrepancies between the actual filter behavior and that of the underlying ideal linear model which the filter is intended to imitate. One form of distortion that is of primary concern is the widely studied topic of limit cycles, which can have two forms. First, limit cycles called parasitic oscillations can occur when the filter is being driven, and these effects are extremely disadvantageous for steady state or period two inputs. Second, limit cycles called self-sustained oscillations can occur even when the filter is intended to be idle (i.e., not filtering) with a zero input.

The problem caused by limit cycles which arise due to nonlinearity of the quantization operation is compounded by the feedback inherent in the filter, and by the fact that several filter sections are usually cascaded. The severity of the problem can be appreciated by considering that for typical second order digital filters, the amplitudes of limit cycle oscillations can be as high as one to two orders of magnitude greater than the largest quantization or round-off error in a single iteration. For perspective, it is to be noted that in some applications the entire normal operating range of a typical filter is roughly three to four orders of magnitude greater than the single iteration quantization error.

Various different approaches have been suggested to deal with the problem of limit cycles. One common technique to simply to increase the internal word length of the filter beyond the encoding accuracy of the input signal. This approach allows limit cycles to exist, but eliminates their effect on the system in which the filter is employed. The expenses of such a solution can be prohibitive when it is realized that word length must be nearly doubled to completely eliminate limit cycle distortion. In another approach, which is designed to eliminate or at least reduce the amplitude of limit cycles, Buttner ("A Novel Approach to Eliminate Limit Cycles in Digital Filters with a Minimum Increase in the Quantization Noise", Proc. 1976 IEEE Intl. Symp. Circuits and Systems, pp. 291-294, April 1976) and Lawrence and Mina ("Control of Limit Cycles in Recursive Digital Filters Using Constrained Random Quantization", IEEE Trans. on Acoustics, Speech and Signal Processing, Vol. 26, No. 1, April 1978, pp. 127-134) teach the introduction of random noise into the quantizer input, in order to obtain a "random rounding" characteristic. Also, Fetterweis and Meerkotter ("Suppression of Parasitic Oscillations in Wave Digital Filters", IEEE Trans. CAS-22, 1975, pp. 668-673) and Meerkotter and Wegener ("A New Second-Order Digital Filter without Parasitic Oscillations", AEU, Electronics and Communications, Band 29, 1975, pp. 312-314) have proposed structural changes in the direct form configuration of conventional digital filters to achieve limit cycle control. In yet another proposal, Butterweck ("Suppression of Parasitic Oscillations in Second-Order Digital Filters by Means of a Controlled Rounding Arithmetic", AEU (Archive Electtvonik Ubertragungstechik), Electronics and Communications, Band 29, 1975, pp. 371-374) introduced the concept of controlled rounding, wherein a memory capability is used to determine how the quantizer output should be treated.

While the above proposals produce acceptable results under certain circumstances, the types of limit cycles which are of concern in many practical applications are not altogether satisfactorily treated, and the solutions can often be complicated and expensive. For example, the Butterweck apparatus has the property that all self-sustained oscillations (i.e., those with zero input) are eliminated except those with period up to two. Unfortunately, the amplitude of these remaining limit cycles can be quite high, particularly in high Q filters with high and low frequency poles. This severely limits the attractiveness of the Butterweck approach insofar as this extremely useful type of filter is concerned.

In view of the foregoing, it is the broad object of the instant invention to provide a controlled rounding technique that can suppress both self-sustained oscillations and parasitic oscillations for d.c. and period two inputs, in all direct form second order digital filters for which the underlying linear system is stable. This technique should take account of both quantization effects, and also the effects of overflow, thereby enabling use of a finite state machine (a filter of the type described) to perform functions theoretically intended for the ideal model. The foregoing objective is desirably achieved in filters which have high and low frequency poles, which filters are the ones of highest commercial interest.

SUMMARY OF THE INVENTION

In accordance with the present invention, limit cycles are eliminated in digital filters which provide an output $X_{n+1}$ which is the quantized value of the quantity $y_n = a \cdot X_n + b \cdot X_{n-1} + U_n$, where a and b are fixed multiplier coefficients, $U_n$ is the input to the filter, and $X_n$ and $X_{n-1}$ (denominated state variables) are once and twice delayed versions of the filter output $X_{n+1}$. Elimination is total for the following input conditions:

(a) zero input, $U_n \equiv 0$, (b) d.c. inputs, i.e., $U_n = U$, U any non-zero constant; and (c) period two inputs, i.e., $U_n = (-1)^n U$, U any non-zero constant.

The elimination is enabled by logic means which monitor the state variables $X_n$ and $X_{n-1}$ within the filter and make a decision as to the quantizer output $X_{n+1} = p$ or $p+k$ (p and k integers)

where $p \leq y_n < p+k$, such that $X_{n+1} = p$ if: $y_n = p$ or $X_{n-1} < p$ or $(X_{n-1} - k) = p$ and $|X_n + Sgn(a)X_{n-1}| \geq T$ or $X_{n-1} = p$ and $|X_n + Sgn(a)X_{n-1}| < T$, and $X_{n+1} = p+k$ if:

$X_{n-1} - k > p$ or $X_{n-1} = p$ and $|X_n + Sgn(a)X_{n-1}| \geq T$ or $(X_{n-1} - k) = p$ and $|X_n + Sgn(a)X_{n-1}| < T$, where Sgn(a) is the sign of the multiplier coefficient a, T is a preselected threshold value, and k is the quantizer step size.

In accordance with the invention, the circuitry used to implement the logic means is relatively simple and inexpensive, and yet fully achieves the objects set forth above.

BRIEF DESCRIPTION OF THE DRAWING

The present invention will be more fully appreciated by consideration of the following detailed description when read in light of the accompanying drawing in which.

DETAILED DESCRIPTION

While second order recursive digital filters are often implemented with two single precision multipliers whose individual products are quantized to the original word length of the filter before any addition is performed, recent innovations in hardware have made other implementations more attractive. Since the implementation used will have an effect on the type of limit cycles produced, the present invention is intended for use with the type of filter section that uses distributed arithmetic blocks or read-only memories (see, for example, A. Croisier et al, "Digital Filter for PCM Encoded Signals", U.S. Pat. No. 3,777,130, Dec. 3, 1973, and A. Peled and B. Liu, "A New Hardware Realization of Digital Filters", *IEEE Trans. ASSP*, Vol. 22, Dec. 1974, pp. 46-48) or with filters which use double precision multipliers of the type suggested by J. R. Mack, "Digital Signal Processing Handbook", Advanced Micro Devices, Inc., Sunnyvale, California, pp. 28-40, 1976, and J. C. Hoffman et al, "Iterative Logical Network for Parallel Multiplication", *Electronics Letters*, No. 4, 1968, page 178, to replace the two single precision multipliers used heretofore. Such filters, shown in block diagram form in FIG. 1, are characterized by only a single quantizer in the feedback loop, rather than the two-quantizer equivalent which characterizes the two multiplier implementation.

Figure 1:
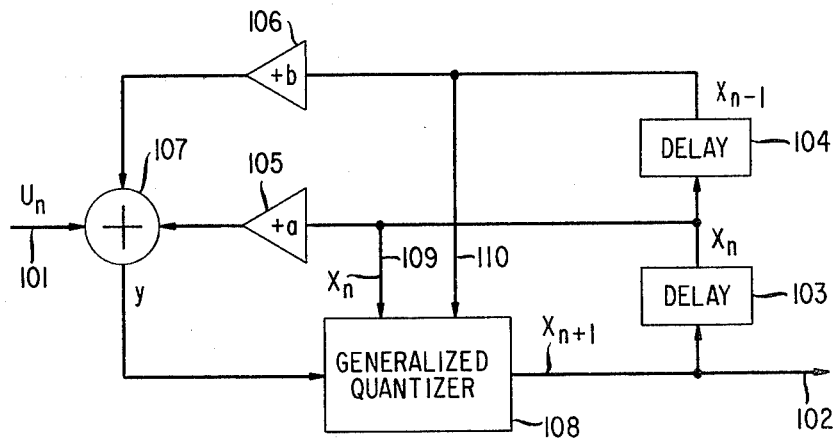
FIG. 1 is a block diagram of a prior art second order filter of the type involved in the present invention.

In FIG. 1, the input sequence to the filter on line 101 is designated $\{U_n\}$ and the output sequence on line 102 is designated $\{X_{n+1}\}$, where n is an integer representing the sampling interval used by the quantizer. The filter includes first and second delay elements 103 and 104 disposed between the output and the input, each delay element being arranged to delay its input by one sampling interval n. The outputs of elements 103 and 104 are denominated state variables $X_n$ and $X_{n-1}$, respectively, and are once and twice delayed versions of the filter output $X_{n+1}$. These signals are applied to the inputs of respective multipliers 105 and 106, which are arranged to multiply the inputs by fixed coefficients a and b, respectively, and to apply their outputs to an adder circuit 107 which algebraically combines the outputs with the input $U_n$. The output of adder 107, designated $y_n$, is then applied to a quantizer 108 which provides an output word $X_{n+1}$ of j bits. The value of $X_{n+1}$ output from quantizer 108 on line 102 depends upon the quantization technique employed in the quantizer, as discussed more fully below. In any event, the quantizer output is given as p or p+k, where:

$$p < aX_n + bX_{n-1} + U_n < p+k.$$

In the foregoing, both p and k are integers, since it is convenient to refer to a unity step size k=1. However, any integer step size may be used. Furthermore, in some implementations, the largest word present in the filter is normalized to unity; in this case, p and k assume binary fractioned values, and if the binary word consists of j bits, then $k = 2^{-j}$.

In accordance with the present invention, the selection of $X_{n+1}$ as p or p+k depends, among other things, upon the values of the state variables $X_n$ and $X_{n-1}$ which are coupled to quantizer 108 on lines 109 and 110, respectively.

To put the present invention in perspective, consideration of the techniques used in the prior art to deal with the limit cycle problem is instructive. In most early digital filter implementations, quantization of $y (\triangleq aX_n + bX_{n-1} + U_n)$ to form $X_{n+1}$ was achieved by either truncating or rounding the quantizer output to the original filter word length. If truncation was used, the least significant bits of the quantizer output beyond the decimal point were discarded, so that the value of $X_{n+1}$ was always selected as p in two's complement arithmetic. By way of comparison, "rounding" in two's complement arithmetic with k=1 comprehends the following rules:

For $y \geq 0$,
(a) Select $X_{n+1}$ to be p+1 if y>(p+0.5)
(b) Otherwise select $X_{n+1}$ to be p.
for y<0,
(a) Select $X_{n+1}$ to be p if y<(p+0.5)
(b) Otherwise select $X_{n+1}$ to be p+1.

In certain later methods, referred to previously, the quantizer was arranged to shift between rounding and truncation on a random basis. This technique worked in some cases, but on other cases produced even longer limit cycles. As explained in U.S. Pat. No. 4,034,197 issued to V. B. Lawrence and K. V. Mina on July 5, 1977, the latter problem could be avoided by inhibiting the random truncation as a function of the values of one or both of the state variables $X_n$ and $X_{n-1}$.

The values of the state variables are also used by Butterweck to control the quantizer output, but random truncation is not involved in his apparatus. Instead, the quantizer (k=1) is arranged to select $X_{n+1} = p$ if $y = p$ or $X_{n-1} \leq p$ but to select $X_{n+1} = p + l$ if $X_{n-1} > p$.

Here again, significant self-sustained and parasitic oscillations remain.

Figure 2:
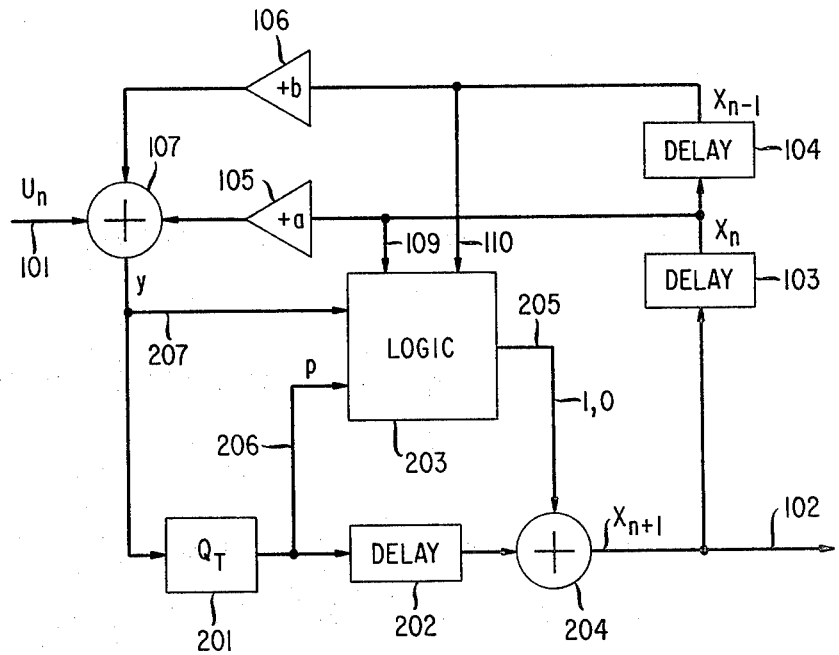
FIG. 2 is an overall block diagram of a filter constructed in accordance with the present invention.

The technique used in the present invention to eliminate limit cycles is illustrated in general terms in FIG. 2, in which components identical to those in FIG. 1 have retained the same designations. Specifically, the output on line 102 is applied to delay elements 103 and 104, the outputs of which are coupled to multipliers 105 and 106, respectively. As in FIG. 1, the multiplier coefficients are a and b, respectively, and the multiplier outputs are algebraically summed with the input on line 101 in adder 107.

In FIG. 2, the output of adder 107 is applied to a quantizer 201 which always truncates the input data to the desired word length. The input data is assumed to be in serial flow, two's complement format, with a 0 in the sign-bit representing a positive number and a "1" in the sign-bit representing a negative number. The output of quantizer 201, which thus corresponds to the integer p referred to above, is applied via delay element 202 to one input of an adder 204. The remaining input to adder 204 is derived from a logic circuit 203 which serves to determine when the quantizer output p is to be boosted to the next step p+k by application of the value "k" on line 205. Logic 203, to be described hereinafter, receives $X_n$ and $X_{n-1}$ inputs on lines 109 and 110 from the delay elements 103 and 104, respectively, and also the y input to and the p output from quantizer 201 on lines 207 and 206, respectively. The delay provided by element 202 is sufficient to allow logic 203 time to provide an input to adder 204 in synchronism with the input derived from quantizer 201.

In accordance with the present invention, the output of logic 203 is low, thereby selecting $X_{n+1}=p$, under the following conditions:
 (a) $Y=p$ or
 (b) $X_{n-1}<p$ or
 (c) $X_{n-1}-k=p$ and $|X_n+Sgn(a)X_{n-1}| \geq T$ or
 (d) $X_{n-1}=p$ and $|X_n+Sgn(a)X_{n-1}|<T$.

Alternatively, the output of logic 203 goes high, thereby adding "k" to the output of adder 204 and thus selecting $X_{n+1}=p+k$, under the following conditions:
 (a) $X_{n-1}-k>p$ or
 (b) $X_{n-1}=p$ and $|X_n+Sgn(a)X_{n-1}| \geq T$ or
 (c) $X_{n-1}-k=p$ and $|X_n+Sgn(a)X_{n-1}|<T$.

In the foregoing, T is a constant, preferably in the range $1<T<5$, and Sgn(a) represents only the sign of the multiplier coefficient a. For a filter with a high frequency complex pole, a is less than zero, so Sgn(a) is negative. For a filter with a low frequency complex pole, $a>0$, so Sgn(a) is positive.

Figure 3:
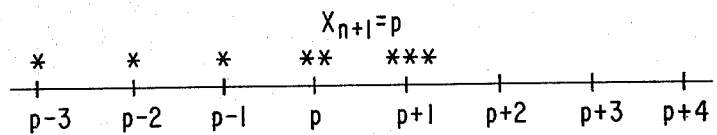
FIGS. 3 and 4 graphically illustrate the rules used to control the quantizer of FIG. 2.
Figure 4:
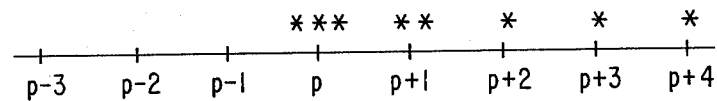

The foregoing selection rules for $X_{n+1}$ can be illustrated with the aid of FIGS. 3 and 4, for the case where $k=1$. In FIG. 3, $X_{n+1}$ will be selected as p if $y=p$ (exactly) or if $X_{n-1}$, the twice delayed filter output, is one of the values (p−1 or less) shown by an asterisk "*". If $X_{n-1}=p$ (indicated "") or p+1 (indicated "*"), a comparison is made between the magnitudes of $X_n$ and $X_{n-1}$, taking the sign of a into account. If $X_{n-1}=p$ and the magnitude of $X_n+Sgn(a)X_{n-1}$ does not differ by the amount T, $X_{n+1}$ is selected as p; if otherwise, $X_{n+1}=p+1$. Similarly, if $X_{n-1}=p+1$ and the aforesaid magnitude does differ by the amount T (or more), $X_{n+1}$ is selected as p; if otherwise, $X_{n+1}=p+1$.

In FIG. 4, $X_{n+1}$ will be selected as p+1 if $X_{n-1}$ is one of the values (p+2 or more) shown by an asterisk. If $X_{n-1}=p+1$ (indicated "") or p (indicated "*"), the comparison referred to above is made, and the appropriate value for $X_{n+1}$ is selected.

The foregoing rules for selection of the quantizer output can be restated as follows:

If the quantizer input is exactly an integer p, its output is also selected as p. If the quantizer input is a non-integer between p and p+k, the quantizer output is truncated to p if $X_{n-1}$, the twice delayed filter output, is p−k or less. On the other hand, if $X_{n-1}$ is p+2k or more, the quantizer output is boosted to p+k. The preceding general rules are modified, however, when $X_{n-1}$ is p or p+k. In these cases, the magnitudes of the once and twice delayed filter outputs $X_n$ and $X_{n-1}$ are compared with each other and with a threshold T. For a filter with low frequency poles (multiplier coefficient $a>0$), truncation occurs if $X_{n-1}=p$ and $|X_n+X_{n-1}|<T$ or if $X_{n-1}=p+k$ and $|X_n+X_{n+1}| \geq T$.

Boosting occurs if $X_{n-1}=p$ and $|X_n+X_{n-1}| \geq T$ or if $X_{n-1}=p+k$ and $|X_n+X_{n-1}|<T$. For a filter with high frequency poles (multiplier coefficient $a<0$), the magnitude of the difference between $X_n$ and $X_{n-1}$ is used in the above equations. Thus, if
 $|X_n-X_{n-1}|<T$ and $X_{n-1}=p$, or
 $|X_n-X_{n-1}| \geq T$ and $X_{n-1}=p+k$
the truncated output p is selected. Alternatively, the boosted output p+k is selected if
 $|X_n-X_{n-1}| \geq T$ and $X_{n-1}=p$ or
 $|X_n-X_{n-1}|<T$ and $X_{n-1}=p+k$.

It should be noted here that, in general, $|1-m|=|m-1|$ for all l and m, so that the terms $X_n$ and $X_{n-1}$ in the above equations may be reversed without any change in result.

A filter of the type described with $T=2$ is successful in eliminating self-sustained oscillations for all possible values of the multiplier coefficients a and b. In addition, parasitic oscillations are suppressed for all period 1 ($U_n=U$, a constant) and symmetrical period 2 ($U_n=-1^nU$) input sequences. This capability exists regardless of whether the steady state output sequences of the infinite precision model are composed of exact integers.

Figure 5:
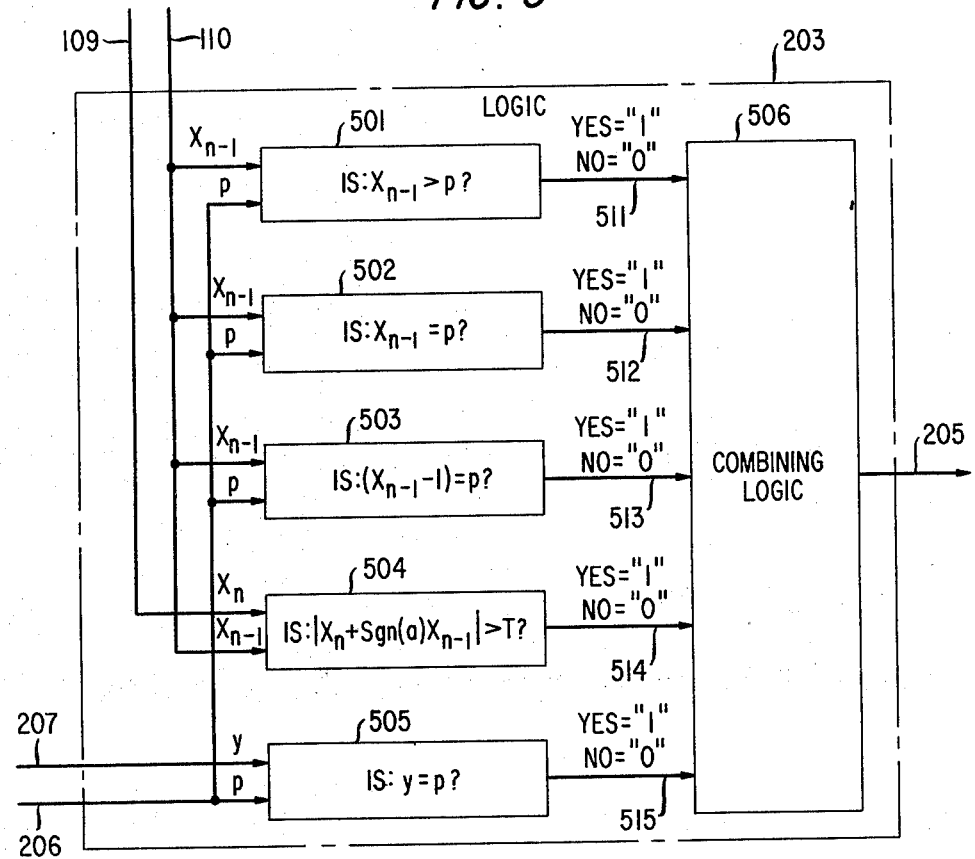
FIG. 5 is a general block diagram of the logic of FIG. 2.

Logic 203 of FIG. 2 may be implemented in the general fashion shown in block diagram form in FIG. 5. For convenience, a step size $k=1$ is chosen. The logic includes 5 sections 501–505 which operate as follows: section 501 receives $X_{n-1}$ and p inputs from lines 110 and 206, respectively, and provides a high output on line 511 if $X_{n-1}>p$. Section 502 receives the same inputs and provides a high output on line 512 if $X_{n-1}=p$, while section 503 also receives the same inputs and provides a high output on line 513 if $X_{n-1}-1=p$. Section 504 receives $X_n$ and $X_{n-1}$ inputs on lines 109 and 110, respectively, and provides a high output on line 514 if $|X_n+Sgn(a)X_{n-1}|>T$. Finally, section 505 receives y and p inputs on lines 207 and 206, respectively, and provides a high output on line 515 if $y=p$.

Logic 203 also includes a sixth section 506 which receives inputs from sections 501–505 and which provides a high output on line 205 when a "1" is to be supplied to adder 204.

Figure 6:
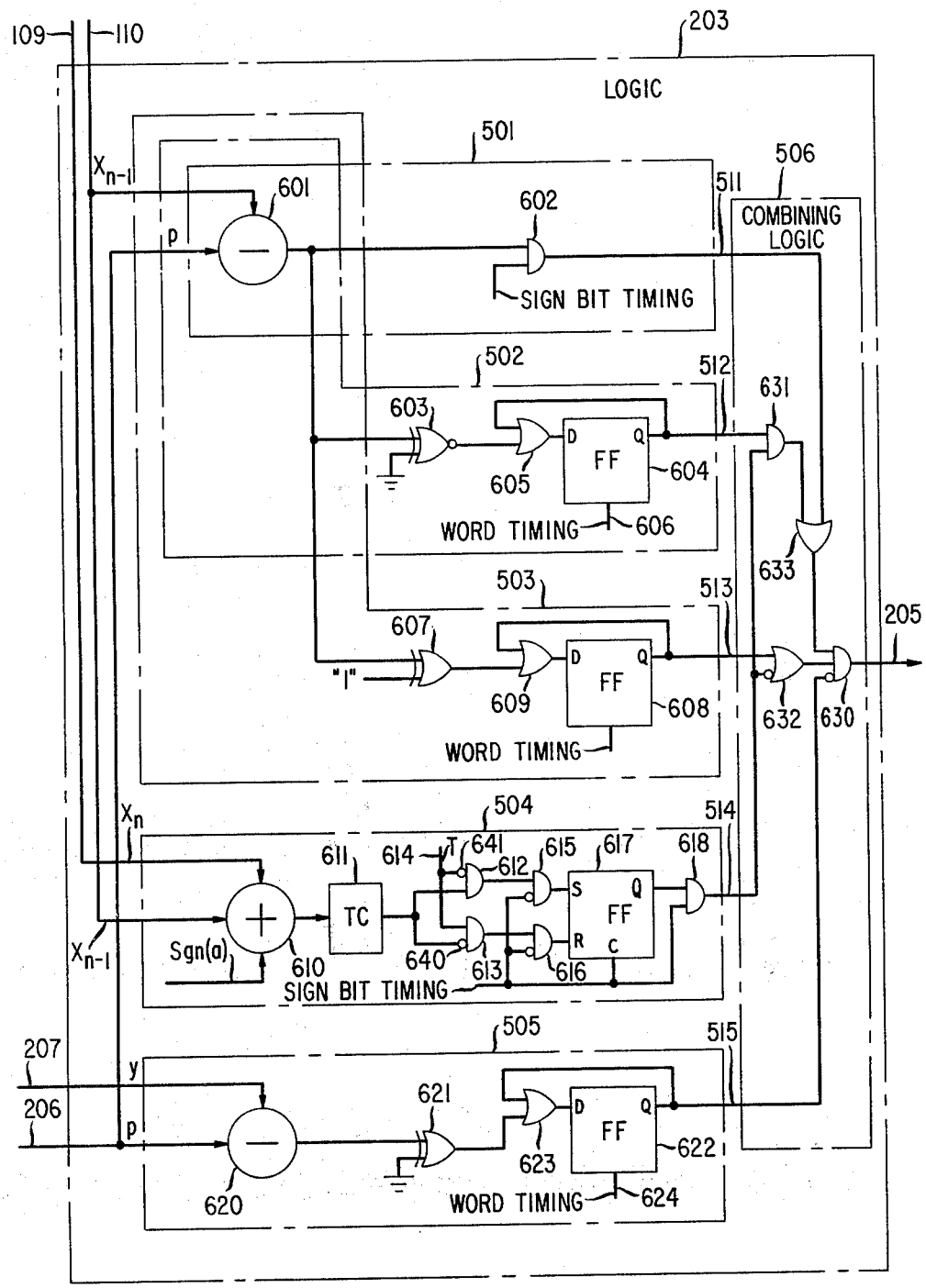
FIG. 6 is a detailed circuit diagram of the logic of FIG. 5.

The details of sections 501–506 are shown in FIG. 6. Section 501 includes a subtractor 601 which forms the difference between p and $X_{n-1}$ and supplies it to one input of AND gate 602. The remaining input to gate 602 is derived at the sign-bit of the word being processed, so that the output on line 511 is high if $X_{n-1}>p$.

Section 502 includes exclusive NOR gate 603 which receives one input from subtractor 601 and a second input from ground. If $X_{n-1}=p$, the high output of gate 603 is passed through OR gate 605 to the d input of flip-flop 604, which is set at the end of the word being processed by a clock input on line 606. The output of flip-flop 604 on line 512 remains high until the next timing pulse by feedback from its output to a second input of OR gate 605.

Section 503 is identical to section 502, except an exclusive OR gate 607 is used and has its second input tied to a logic "1". When the output of gate 607 is high, $X_{n-1}-1 \neq p$. This output is fed via OR gate 609 to the d input to flip-flop 608, which is set at the end of each quantizer output word. Again, feedback via gate 609 keeps flip-flop 608 in a given state for the entire word processing interval.

Section 504 includes an algebraic combiner (adder) 610 which receives $X_n$ on line 109 and $X_{n-1}$ on line 110.

The sign of combiner 610 (i.e., adder or subtractor) is controlled by the sign of the multiplier coefficient a. The quantity output from adder 610 is complemented in two's complementer 611 to change from two's complement to sign magnitude form, and is then applied to first inputs of AND gates 612 and 613 on a bit serial basis. An inverter 640 is, however, inserted in the gate 613 input line. The second input of AND gate 613 receives the quantity T from line 614, also on a bit serial basis, while the second input of AND gate 612 receives the inverse of the bits which represent the number T, due to the presence of inverter 641. The outputs of gates 612 and 613 are passed through respective AND gates 615 and 616 except when the sign bit is high, and used to set or reset a flip-flop 617, depending upon which gate was high. As shown in the following Table, flip-flop 617 is set when any bit representing the quantity $|X_n+Sgn(a)X_{n-1}|$ is a "1" while the corresponding bit representing the quantity T is a "0". Conversely, flip-flop 617 is reset when the former is a "0" and the latter is a "1". Under all other conditions, the state of the flip-flop is unchanged.

| Current State of Flip-flop 617 | T | $\|X_n + Sgn(a)X_{n-1}\|$ | Set | Reset | Next State of Flip-flop 617 |
|---|---|---|---|---|---|
| 0 | 0 | 0 |  |  | 0 |
| 0 | 0 | 1 | Yes |  | 1 |
| 0 | 1 | 0 |  | Yes | 0 |
| 0 | 1 | 1 |  |  | 0 |
| 1 | 0 | 0 |  |  | 1 |
| 1 | 0 | 1 | Yes |  | 1 |
| 1 | 1 | 0 |  | Yes | 0 |
| 1 | 1 | 1 |  |  | 1 |

Since both quantities are in serial form, with the most significant bit last, the final state of flip-flop 617 thus indicates if T is greater or less than $|X_n+Sgn(a)X_{n-1}|$, as desired. The Q output of flip-flop 617 in turn raises the output of AND gate 618, at the occurrence of the sign bit timing pulse, indicating that $|X_n+Sgn(a)X_{n-1}| \geq T$.

Section 505 is also like section 502. The difference between y and p is formed in subtractor 620 and applied to one input of exclusive OR gate 621, the other input of which is grounded. If y=p, flip-flop 622 is set, and stays set due to feedback via OR gate 623. Clocking is again provided by a word timing pulse on line 624.

Section 506 includes AND gates 630 and 631 and OR gates 632 and 633, interconnected so as to generate a high output from gate 630 if (a) $X_{n-1}-1 > p$ (line 511 high, line 513 high, line 515 low) or if (b) $X_{n-1}=p$ and $|X_n+Sgn(a)X_{n-1}| > T$ (lines 512, 513 and 514 high, line 515 low) or if (c) $X_{n-1}-1=p$ and $|X_n+Sgn(a)X_{n-1}| \leq T$ (lines 511 and 513 high and line 515 low).

It will be apparent to those skilled in the art that various modifications and adaptations can be made to the above-described embodiments of the present invention without departing from the spirit and scope of the invention as a whole. Accordingly, it is intended that the invention is limited only by the following claims.

We claim:

1. A second order recursive digital filter adapted to receive an input signal $U_n$ including
 a quantizer (201) adapted to provide a fixed length output word p in response to an input word y, where $p < y < p+k$ and k is the quantizer step size;
 means (103, 104) for providing once and twice delayed versions ($X_n$ and $X_{n-1}$, respectively) of the output $X_{n+1}$ of said filter;
 means (105, 106) for forming the products of said once and twice delayed versions with multiplier coefficients a and b, respectively;
 means (107) for combining said products and said input signal $U_n$ to generate said input word y; and
 means (204) for selecting said filter output $X_{n+1}$ as p or p+k,

CHARACTERIZED BY logic means (203) for selecting $X_{n+1}=p+k$ if (1) $X_{n-1} > p+k$ or (2) $X_{n-1}=p$ and $|X_n+Sgn(a)X_{n-1}| \geq T$ or (3) if $X_{n-1}=p+k$ and $|X_n+Sgn(a)X_{n-1}| < T$, where T is a fixed threshold value and Sgn(a) is the sign of said multiplier coefficient a.

2. The invention defined in claim 1 wherein the length of said output word is j bits, and $k=2^{-j}$.

3. The invention defined in claim 1 wherein $1 < T < 5$.

4. The invention defined in claim 1 wherein said filter has a low frequency complex pole and Sgn(a) is positive.

5. The invention defined in claim 1 wherein said filter has a high frequency complex pole and Sgn(a) is negative.

6. The invention defined in claims 4 or 5 wherein said logic means includes:
 means (501) arranged to provide a first control signal if $X_{n-1} > p$;
 means (502) for providing a second control signal if $X_{n-1}=p$;
 means (503) for providing a third control signal if $X_{n-1} \neq p+k$;
 means (504) for providing a fourth control signal if $|X_n+Sgn(a)X_{n-1}| > T$;
 means (505) for providing a fifth control signal if $y \neq p$; and
 means (506) jointly responsive to said first through fifth control signals for generating a sixth control signal only (1) in the presence of said fifth signal and (2) in the presence of said first or second and fourth control signals and (3) in the presence of said third control signal or the absence of said fourth control signal.

7. A second order recursive digital filter having a high frequency complex pole arranged to receive an input signal $U_n$, where n is a sampling interval, comprising:
 means for forming a once delayed version $X_n$ of the output $X_{n+1}$ of said filter and a twice delayed version $X_{n-1}$ of said output of said filter;
 means for forming the products $a \cdot X_n$ and $b \cdot X_{n-1}$, where a and b are multiplier coefficients, a being negative;
 means for forming the sum $y_n$ of said products and said input signal $U_n$;
 means for truncating $y_n$ to a j-bit word of value p, where $p \leq y < p+k$ and where $k=2^{-j}$; and
 means for selecting the output of said filter $X_{n+1}$ as p if $y_n=p$ or $X_{n-1} < p$ or $(X_{n-1}-1)=p$ and $|X_n-X_{n-1}| \geq T$ or $X_{n-1}=p$ and $|X_n-X_{n-1}| < T$, or to select $X_{n+1}=p+1$ if $X_{n-1} - 1 > p$ or $X_{n-1} = p$ and $|X_n - X_{n-1}| \geq T$ or $(X_{n-1} - 1) = p$ and $|X_n - X_{n-1}| < T$, where T is a preselected threshold value.

8. A second order recursive digital filter having a low frequency complex pole arranged to receive an input signal $U_n$, where n is a sampling interval, comprising:

means for forming a once delayed version $X_n$ of the output $X_{n+1}$ of said filter and a twice delayed version $X_{n-1}$ of said output of said filter;

means for forming the products $a \cdot X_n$ and $b \cdot X_{n-1}$, where a and b are multiplier coefficients, a being positive;

means for forming the sum $y_n$ of said products and said input signal $U_n$;

means for truncating $y_n$ to a j-bit word of value p, where $p \leq y < p+k$ and where $k = 2^{-j}$; and means for selecting the output of said filter $X_{n+1}$ as p if $y_n = p$ or $X_{n-1} < p$ or $(X_{n-1} - 1) = p$ and $|X_n + X_{n-1}| \geq T$ or $X_{n-1} = p$ and $|X_n + X_{n-1}| < T$, or to select $X_{n+1} = p + l$ if $X_{n-1} - 1 > p$ or $X_{n-1} = p$ and $|X_n + X_{n-1}| \geq T$ or $(X_{n-1} - 1) = p$ and $|X_n + X_{n-1}| < T$, where T is a preselected threshold value.

9. In a second order recursive digital filter for providing an output $X_{n+1}$ which is the quantized value of $$y_n = a \cdot X_n + b \cdot X_{n-1} + U_n$$

where n is a uniform sampling interval, $X_n$ and $X_{n-1}$ are once and twice delayed versions of $X_n$, respectively, a and b are multiplier coefficients, and $U_n$ is the input to said filter, apparatus for eliminating limit cycles in said output for zero, d.c. and period 2 inputs, said apparatus including:

(a) means for quantizing $y_n$ to a j-bit word of value p, where $p < y_n < p+k$ and $k = 2^{-j}$, and (b) means for selecting $X_{n+1}$ as p or p+k as a function of (a) the relative values of $X_{n-1}$ and p and (b) the relative values of $X_n$, $X_{n-1}$ and a threshold value T.

* * * * *

UNITED STATES PATENT AND TRADEMARK OFFICE
CERTIFICATE OF CORRECTION

PATENT NO. : 4,213,187

DATED : July 15, 1980

INVENTOR(S) : Victor B. Lawrence and Debasis Mitra

It is certified that error appears in the above-identified patent and that said Letters Patent are hereby corrected as shown below:

Column 1, line 40, "to", first occurrence, should read --is--. Column 4, line 7, that portion of the formula reading "$p < aX_n$" should read --$p \leq aX_n$--. Column 6, line 6, "difference" should read --difference--.

Signed and Sealed this

Eleventh Day of November 1980

[SEAL]

Attest:

SIDNEY A. DIAMOND

Attesting Officer

Commissioner of Patents and Trademarks